(12) United States Patent
Dow

(10) Patent No.: US 6,358,129 B2
(45) Date of Patent: *Mar. 19, 2002

(54) BACKING MEMBERS AND PLANARIZING MACHINES FOR MECHANICAL AND CHEMICAL-MECHANICAL PLANARIZATION OF MICROELECTRONIC-DEVICE SUBSTRATE ASSEMBLIES, AND METHODS OF MAKING AND USING SUCH BACKING MEMBERS

(75) Inventor: Daniel B. Dow, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,403

(22) Filed: Nov. 11, 1998

(51) Int. Cl.[7] ................................................. B24B 5/00
(52) U.S. Cl. ................... 451/285; 451/287; 451/288; 451/289; 451/384; 451/388; 451/397
(58) Field of Search ................................ 451/285–292, 451/384, 388, 397, 398, 385

(56) References Cited

U.S. PATENT DOCUMENTS

| | | | | |
|---|---|---|---|---|
| 2,998,680 A | * | 9/1961 | Lipkins | 451/289 |
| 4,597,228 A | * | 7/1986 | Koyama et al. | 451/289 |
| 4,625,463 A | * | 12/1986 | Sekiya | 451/289 |
| 4,671,145 A | * | 6/1987 | Fehrenbach et al. | 451/388 |
| 5,441,444 A | * | 8/1995 | Nakajima | 451/388 |
| 5,597,346 A | * | 1/1997 | Hempel, Jr. | 451/289 |
| 5,624,299 A | * | 4/1997 | Shendon | 451/289 |
| 5,797,789 A | * | 8/1998 | Tanaka et al. | 451/289 |
| 5,868,896 A | * | 2/1999 | Robinson et al. | 451/289 |
| 5,888,127 A | * | 3/1999 | Piper et al. | 451/289 |
| 5,957,751 A | * | 9/1999 | Govzman et al. | 451/289 |
| 5,964,646 A | * | 10/1999 | Kassir et al. | 451/289 |
| 6,024,630 A | * | 2/2000 | Shendon et al. | 451/289 |
| 6,027,401 A | * | 2/2000 | Saito et al. | 451/388 |

* cited by examiner

Primary Examiner—M. Rachuba
(74) Attorney, Agent, or Firm—Dorsey & Whitney LLP

(57) ABSTRACT

Devices and methods for releasably attaching substrate assemblies to carrier heads of planarizing machines in mechanical and/or chemical-mechanical planarization of microelectronic-device substrate assemblies. One aspect of the invention is directed toward a backing member for use in a carrier head to selectively couple a substrate assembly to the carrier head via a vacuum force before, during and after planarizing the substrate assembly. The backing member can include a body having a first section with a first surface configured to be received by the carrier head and a second section with a second surface configured to support a backside of the substrate assembly. The first and second sections of the body are preferably composed of flexible, incompressible materials. The backing member also includes a first vacuum passageway extending, through the body and a plurality of second vacuum passageways coupled to the first passageway. The first passageway is configured to be coupled to a vacuum source, and each second passageway has an opening at the second surface of the body to transfer a vacuum force from the first passageway to the openings. The second passageways are preferably configured to distribute the vacuum force across the backside of the substrate assembly in a manner that prevents or at least substantially inhibits deformation of the substrate assembly.

59 Claims, 6 Drawing Sheets

BACKING MEMBERS AND PLANARIZING MACHINES FOR MECHANICAL AND CHEMICAL-MECHANICAL PLANARIZATION OF MICROELECTRONIC-DEVICE SUBSTRATE ASSEMBLIES, AND METHODS OF MAKING AND USING SUCH BACKING MEMBERS

TECHNICAL FIELD

The present invention relates to backing members for holding microelectronic-device substrate assemblies to a carrier head in mechanical and/or chemical-mechanical planarization processes. More particularly, the present invention relates to backing members that hold a substrate assembly to a carrier head via a vacuum force during planarization of the substrate assembly on a polishing pad.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly.

FIG. 1 schematically illustrates an existing web-format planarizing machine 10 for planarizing a substrate assembly 12. The planarizing machine 10 has a support table 14 with a top panel 16 at a workstation where an operative portion (A) of a polishing pad 40 is positioned. The top panel 16 is generally a rigid plate to provide a flat, solid surface to support the operative section of the polishing pad 40 during planarization.

The planarizing machine 10 also has a plurality of rollers to guide, position and hold the polishing pad 40 over the top panel 16. The rollers include a supply roller 20, first and second idler rollers 21a and 21b, first and second guide rollers 22a and 22b, and a take-up roller 23. The supply roller 20 carries an unused or preoperative portion of the polishing pad 40, and the take-up roller 23 carries a used or post-operative portion of the polishing pad 40. Additionally, the first idler roller 21a and the first guide roller 22a stretch the polishing pad 40 over the top panel 16 to hold the polishing pad 40 stationary during operation. A drive motor (not shown) drives at least one of the supply roller 20 and the take-up roller 23 to sequentially advance the polishing pad 40 across the top panel 16. As such, clean preoperative sections of the polishing pad 40 may be quickly substituted for used sections to provide a consistent surface for planarizing the substrate assembly 12.

The web-format planarizing machine 10 also has a carrier assembly 30 that controls and protects the substrate assembly 12 during planarization. The carrier assembly 30 generally has a carrier head 31 with a plurality of vacuum holes 32 to pick up and release the substrate assembly 12 at appropriate stages of the planarizing cycle. A plurality of nozzles 41 attached to the carrier head 31 dispense a planarizing solution 42 onto a planarizing surface 43 of the polishing pad 40. The carrier assembly 30 also generally has a support gantry 34 carrying a drive assembly 35 that translates along the gantry 34. The drive assembly 35 generally has actuator 36, a drive shaft 37 coupled to the actuator 36, and an arm 38 projecting from the drive shaft 37. The arm 38 carries the carrier head 31 via another shaft 39 such that the drive assembly 35 orbits the carrier head 31 about an axis B—B offset from a center point C—C of the substrate assembly 12.

Many planarizing machines also use a substrate backing member 50 in the carrier head 31 to support a backside of the substrate assembly 12. The backing member 50 is typically a perforated, flexible pad positioned between the carrier head 31 and the substrate assembly 12. The perforations through the backing member 50 are generally a plurality of uniform pores or holes (not shown) that directly transfer a vacuum force from each vacuum hole 32 in the carrier head 31 to a backside 15 of the substrate assembly 12. In operation, the vacuum force is drawn against the backside 15 of the substrate assembly 12 through the perforated backing member 50 to pick up the substrate assembly 12 from a load station (not shown) or the polishing pad 40.

The polishing pad 40 and the planarizing solution 42 define a planarizing medium that mechanically and/or chemically-mechanically removes material from the surface of the substrate assembly 12. The web-format planarizing machine 10 typically uses a fixed-abrasive polishing pad having a plurality of abrasive particles fixedly bonded to a suspension material. The planarizing solutions used with fixed-abrasive pads are generally "clean solutions" without abrasive particles because additional abrasive particles in conventional abrasive CMP slurries may ruin the abrasive surface of fixed abrasive pads. In other applications, the polishing pad 40 may be a nonabrasive pad composed of a polymeric material (e.g., polyurethane), a resin, or other suitable materials without abrasive particles. The planarizing solutions 42 used with nonabrasive polishing pads are typically "abrasive" CMP slurries with abrasive particles.

To planarize the substrate assembly 12 with the planarizing machine 10, the carrier assembly 30 presses the substrate assembly 12 against the planarizing surface 43 of the polishing pad 40 in the presence of the planarizing solution 42. The drive assembly 35 then orbits the carrier head 31 about the offset axis B—B to translate the substrate assembly 12 across the planarizing surface 43. As a result, the abrasive particles and/or the chemicals in the planarizing medium remove material from the surface of the substrate assembly 12.

CMP processes should consistently and accurately produce a uniformly planar surface on the substrate assembly 12 to enable precise fabrication of circuits and photo-patterns. For example, during the fabrication of transistors, contacts, interconnects and other components, many substrate assemblies develop large "step heights" that create a highly topographic surface across the substrate assembly 12. To enable the fabrication of integrated circuits with high densities of components, it is necessary to produce a highly planar substrate surface at several stages of processing the substrate assembly 12 because non-planar substrate surfaces significantly increase the difficulty of forming submicron features. For example, it is difficult to accurately focus photo-patterns to within tolerances of 0.1 $\mu$m on nonplanar substrate surfaces because submicron photolithographic equipment generally has a very limited depth of focus. Thus, CMP processes are often used to transform a topographical substrate surface into a highly uniform, planar substrate surface.

In the competitive semiconductor industry, it is also highly desirable to have a high yield of operable devices after CMP processing by quickly producing a uniformly planar surface at a desired endpoint on a substrate assembly. For example, when a conductive layer on the substrate assembly 12 is under-planarized in the formation of contacts or interconnects, many of these components may not be electrically isolated from one another because undesirable portions of the conductive layer may remain on the substrate assembly 12. Additionally, when a substrate assembly 12 is over-planarized, components below the desired endpoint may be damaged or completely destroyed. Thus, to provide a high yield of operable microelectronic devices, CMP processing should quickly remove material until the desired endpoint is reached.

One manufacturing concern of CMP processing is slippage between the substrate assembly 12 and the carrier head 31 during planarization. Such slippage is problematic because displacement between the substrate assembly 12 and the carrier head 31 during planarization may crack the substrate assembly 12, damage individual devices, or produce inconsistent planarizing results that cause localized under-planarization or over-planarization on the substrate assembly 12.

Existing techniques to inhibit or prevent slippage between the substrate assembly 12 and the carrier head 31 include coating the backside of the substrate assembly 12 with a wax or fluid, or drawing a vacuum through the carrier head 31 against the substrate assembly 12. Yet, as the continual drive to miniaturize components requires planar surfaces to be within ±100 Å of a desired endpoint, these existing techniques for holding the substrate assembly 12 to the carrier head 31 generally limit the ability to produce an adequately planar surface on the substrate assembly 12. Waxes and fluids are not suitable because they can distort the shape of the substrate assembly 12 and/or contaminate the materials on the substrate assembly 12. Moreover, drawing a vacuum against the backside 15 of the substrate assembly 12 during the planarizing cycle is not suitable because the vacuum force deforms the substrate assembly 12 at areas proximate to the vacuum ports 32 in the carrier head 31. Although such local deformations of the substrate assembly 12 may be slight, they generally create variations on the planarized substrate surface greater than ±100 Å. Therefore, many highly demanding CMP applications do not apply waxes, fluids or a vacuum force to the backside of a substrate assembly during a planarizing cycle.

In light of the problems associated with holding a substrate assembly to a carrier head during a planarizing cycle, many planarizing machines rely on a retaining ring depending from the carrier head 31 to retain the substrate assembly. Referring to FIG. 1, for example, a retaining ring 33 depends from the carrier head 31 to form a cavity in which the backing member 50 and the substrate assembly 12 are positioned. The retaining ring 33, however, typically engages the abrasive particles on the planarizing surface 43 of the polishing pad 40 during the planarizing cycle. As such, retaining rings are replaced periodically, which increases the costs for maintaining and repairing planarizing machines. The substrate assembly 12, moreover, may still slip out underneath the retaining ring during the planarizing cycle. Therefore, retaining rings do not resolve some of the drawbacks of holding a substrate assembly under a carrier head during planarization.

SUMMARY OF THE INVENTION

The present invention is directed toward devices and methods for releasably attaching substrate assemblies to carrier heads of planarizing machines in mechanical and/or chemical-mechanical planarization of microelectronic-device substrate assemblies. One aspect of the invention is a backing member for use in a carrier head to selectively couple a substrate assembly to the carrier head via a vacuum force before, during and after planarizing the substrate assembly.

The backing member can include a body having a first section with a first surface configured to be received by the carrier head and a second section with a second surface configured to support a backside of the substrate assembly. The first and second sections of the body are preferably composed of flexible, incompressible materials. The backing member also includes a first vacuum passageway extending through the body and a plurality of second vacuum passageways coupled to the first passageway and the second surface of the body. The first passageway is configured to be coupled to a vacuum source, and each second passageways extend from the first passageway to corresponding openings at the second surface of the body. The second passageways are preferably configured to distribute the vacuum force across the backside of the substrate assembly in a manner that prevents or at least substantially inhibits deformation of the substrate assembly so that the vacuum force does not adversely affect the planarity of the finished substrate surface.

In further aspects of the invention, the first passageway defines a primary conduit, such as a channel or a grid of channels, extending along a lower surface of the first section. The second passageways define secondary conduits, such as small holes or pores, extending through the second section of the backing member. The secondary conduits preferably extend from the primary conduit to a contact surface defined by the second surface of the body. In operation, the primary conduit in the first section distributes the vacuum force in a first distribution, and the secondary conduits redistribute the vacuum force in a second vacuum distribution at the contact surface for coupling the substrate assembly to the carrier head.

DETAILED DESCRIPTION OF THE INVENTION

The present disclosure describes backing members for releasably attaching substrate assemblies to carrier heads in mechanical and/or chemical-mechanical planarization of microelectronic-device substrate assemblies. The present disclosure also describes methods for making such backing members, and machines and methods for using such backing members. Many specific details of certain embodiments of the invention are set forth in FIGS. 2–5B and the following description to provide a thorough understanding of such embodiments. One skilled in the art, however, will understand that the present invention may have additional embodiments, or that certain embodiments of the invention may be practiced without several of the details described in the following description.

Figure 1:
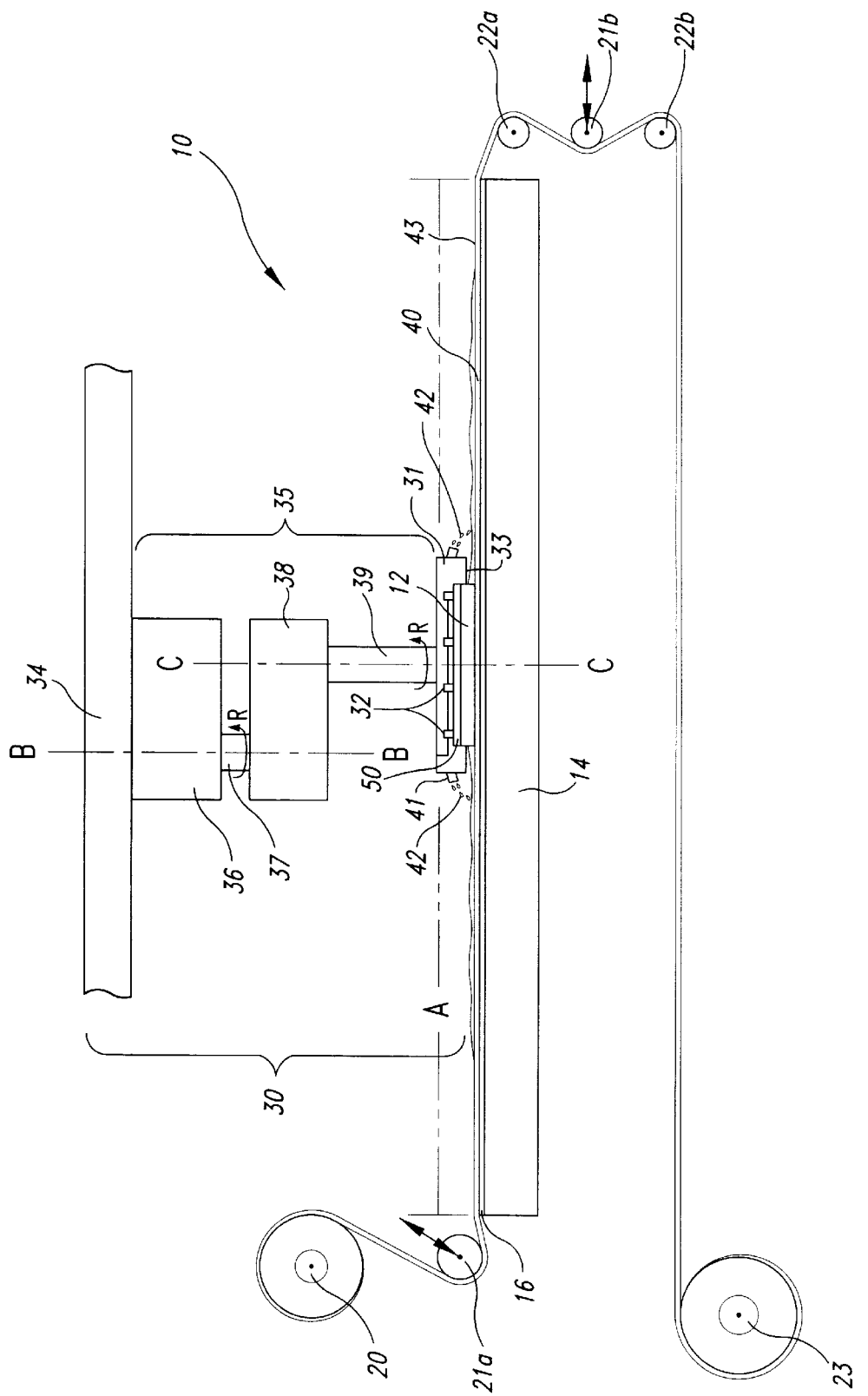
FIG. 1 is a schematic cross-sectional view of a planarizing machine in accordance with the prior art.
Figure 2:
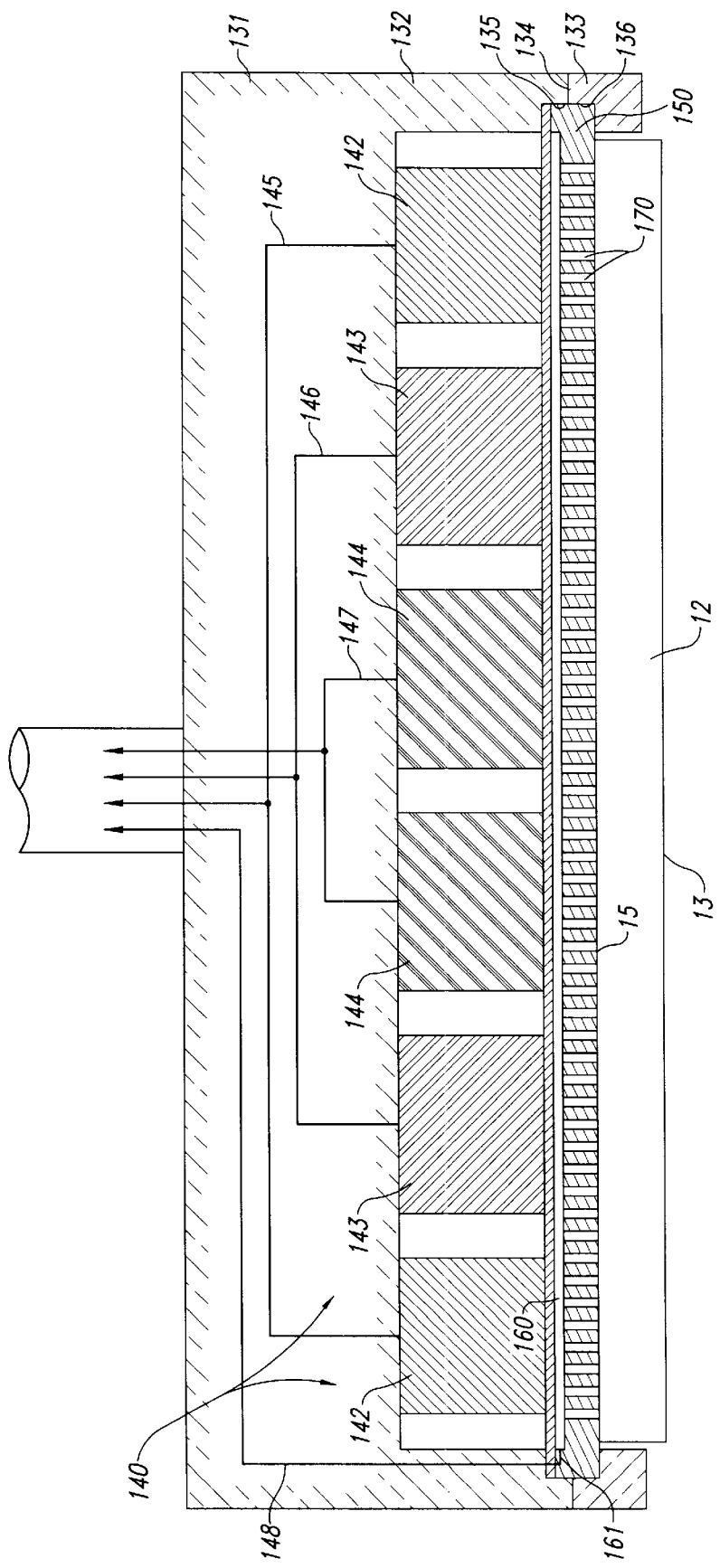
FIG. 2 is a schematic cross-sectional view of a backing member and a carrier head in accordance with an embodiment of the invention.

FIG. 2 is a schematic cross-sectional view of substrate backing member 150 in accordance with one embodiment of the invention for use in a carrier head 131 of a planarizing machine. The substrate backing member 150 is preferably configured to be attached to the carrier head 131 in a cavity formed by a downwardly depending rim 132 and a retaining ring 133 attached to a lower surface 134 of the rim 132. The rim 132 and the retaining ring 133 can also have annular notches 135 and 136 forming an annular groove within the carrier head 132. The backing member 150, more particularly, can be attached to the carrier head 132 in the groove formed by the notches 135 and 136.

The carrier head 131 also preferably has a plurality of substrate shaping actuators 140 adjacent to the backing member 150 to bend the backing member 150 and the substrate 12 into a desired curvature. The actuators 140 can be annular bladders or piezoelectric crystals including an outer actuator 142, an intermediate actuator 143, and an inner actuator 144. When the actuators 140 are bladders, individual fluid lines 145, 146 and 147 couple the bladders 142, 143 and 144, respectively, to an air source. Each actuator 140 is individually controlled to flex the substrate assembly 12 in a manner that increases the pressure behind under-planarized regions of the substrate assembly 12 and reduces the pressure behind over-planarized regions of the substrate 12. The individual fluid lines 145–147 coupled to the actuators 140 are preferably separate from a vacuum source 148 coupled to the backing member 150. As explained in greater detail below, the backing member 150 is preferably a flexible, substantially incompressible body that distributes a vacuum force to a backside 15 of the substrate assembly 12 during planarization without deforming or otherwise distorting the substrate assembly 12 in a manner that adversely affects the planarity of the planarized surface.

Figure 3A:
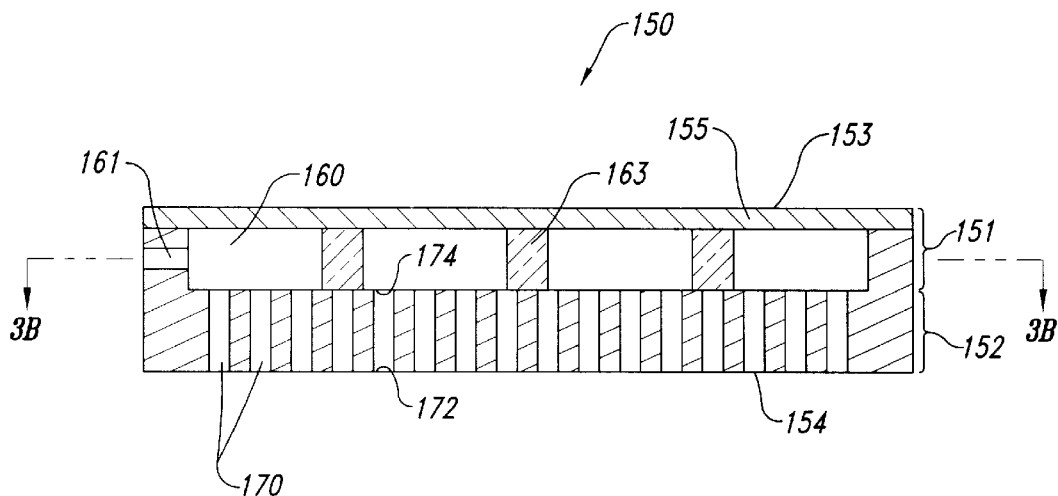
FIG. 3A is a cross-sectional view of the backing member of FIG. 2.
Figure 3B:
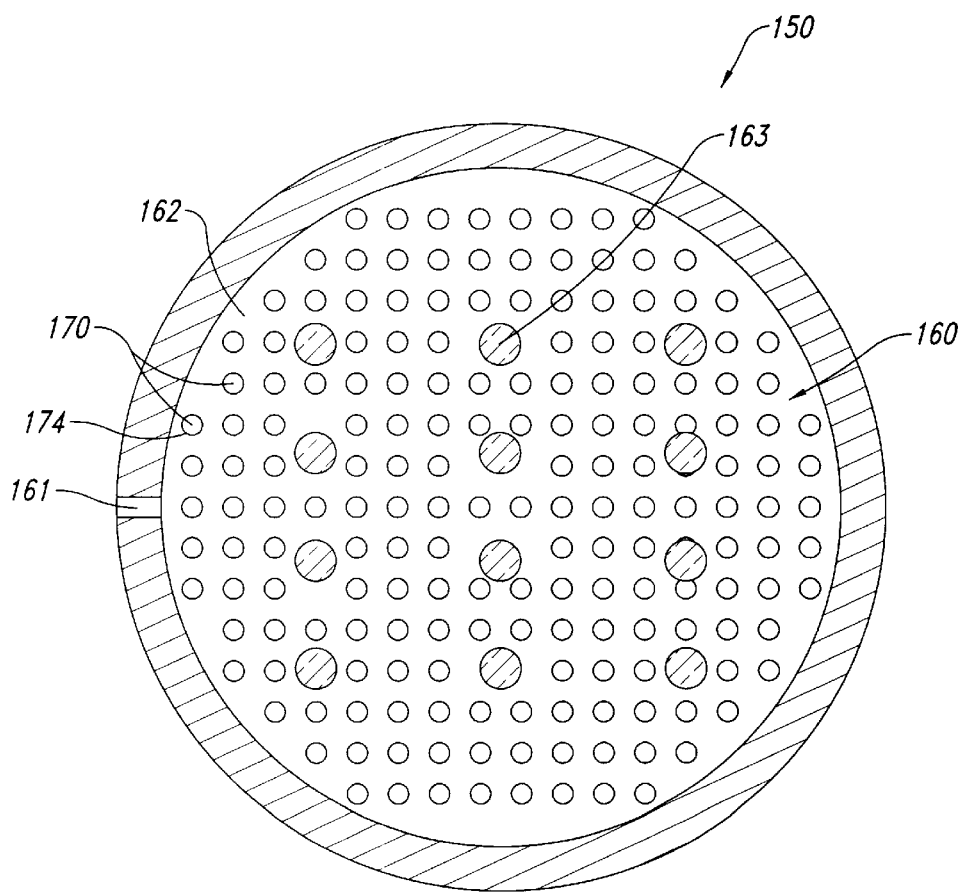
FIG. 3B is a cross-sectional view of the backing member of FIG. 3A taken along plane 3B—3B.

FIG. 3A is a side cross-sectional view and FIG. 3B is a top cross-sectional view along plane 3B—3B illustrating the backing member 150 of FIG. 2 in greater detail. In this embodiment, the backing member 150 comprises a body including a first section 151 (FIG. 3A) having an upper surface 153 configured to contact the actuators 140 (FIG. 2) and a second section 152 (FIG. 3A) having a contact surface 154 configured to engage and support the backside 15 of the substrate assembly 12 (FIG. 2). The first section 151 includes a primary vacuum conduit 160 and a vacuum port 161 open to the primary conduit 160. The vacuum port 161 is configured to be coupled to the vacuum source 148 in the carrier head 131 (FIG. 2). The upper surface 153 of the first section 151 can be the top surface of a separate panel 155 that encloses the primary conduit 160 to form a first passageway through which a vacuum force is distributed in a first vacuum distribution with respect to the substrate 12. In this embodiment, for example, the primary conduit 160 is a large, open chamber in which a number a spacers 163 maintain the spacing between the second section 152 and the top panel 155.

The second section 152 of the body has a plurality of secondary conduits 170 extending from the primary conduit 160 to the contact surface 154. Each secondary conduit 170 preferably has an opening 172 at the contact surface 154 and an aperture 174 open to the primary conduit 160. The secondary conduits 170 are preferably much smaller than the primary conduit 160 to redistribute the vacuum in the primary conduit 160 into a second vacuum distribution at the contact surface 154 for coupling the substrate assembly 12 to the carrier head 131. The secondary conduits 170 are preferably holes having a diameter of approximately 0.01–0.125 inches, and the secondary conduits 170 are preferably spaced apart from one another by approximately 0.01–0.125 inches. The secondary conduits 170 may also have other sizes and be spaced apart from one another by different distances. The secondary conduits 170 can also be other types of perforated structures that can transfer the vacuum force from the primary conduit 160 to the substrate assembly 12. For example, the secondary conduits 170 can be pores through a porous material.

The first and second sections 151 and 152 can be integral members of a one-piece body, as shown in FIGS. 3A and 3B. The first and second sections 151 and 152 of the backing member 150 can be composed of DF-200 manufactured by Rodel Corporation of Newark, Del.; Delrin® or Mylar® manufactured by E. I. du Pont de Nemours Company; high-density polyethylenes; or other flexible, substantially incompressible materials that flex under the actuators 140 (FIG. 2) but do not substantially compress under the vacuum force.

To manufacture the backing member 150 shown in FIG. 2, the primary conduit 160 and the secondary conduits 170 can be etched or machined from a single disc of material. For example, the primary conduit 160 can be etched in one side of the disc, and then the secondary conduits 170 can be etched from the primary conduit 160 to the contact face 154. The top panel 155 is then attached to the body to complete the first section 151 and enclose the primary conduit 160.

In an alternative embodiment, the first and second sections 151 and 152 can be separate sections that are joined together by a fastener or an adhesive. In this case, the first section 151 can be a first disc of material in which the primary conduit 160 is etched in the bottom surface, and the second section 152 can be a second disc in which the secondary conduits 170 are etched. The bottom of the first section 151 is then attached to the second section 152 to assemble the backing member.

Referring to FIGS. 2–3B together, the primary conduit 160 and the secondary conduits 170 transfer a vacuum force drawn through the vacuum port 161 to the backside 15 of the substrate assembly 12. The primary conduit 160 initially distributes the vacuum force in the first distribution over a significant percentage of the surface area of the backside 15 of the substrate assembly 12. The secondary conduits 170 then redistribute the vacuum force in the second vacuum distribution to a large number of small surface areas on the backside 15 of the substrate assembly 12. The contact surface 154 of the second section 150 supports the substrate assembly 12 between the secondary conduits 170 to prevent localized deformation of the substrate assembly 12. Moreover, because the openings 172 of the secondary conduits 170 are relatively small, the distances across the unsupported portions of the substrate assembly 12 are sufficiently small to prevent localized deformation of the substrate assembly 12 at the secondary conduits 170. The primary conduit 160 and the secondary conduits 170, therefore, apply the vacuum force across the backside 15 of the substrate assembly 12 such that the contact surface 154 can inhibit or prevent localized deformation of the substrate assembly 12.

The operation of the backing member 150 is best understood in the context of the carrier head 131 shown in FIG. 2. To pick up the substrate assembly 12, the carrier head 131 presses the contact surface 154 of the backing member 150 against the backside 15 of the substrate assembly 12 and draws a vacuum through the vacuum port 161 via the vacuum source 148. After the substrate assembly 12 is attached to the carrier head 131, the actuators 140 may be manipulated to bend the backing member 150 and the substrate assembly 12 into the desired global curvature for planarizing the substrate assembly 12. The carrier head 131 then presses the substrate assembly 12 against a polishing pad (not shown) and translates the substrate assembly 12 across the planarizing surface of the polishing pad. The vacuum force drawn through the backing member 150 is preferably maintained against the substrate assembly 12 during the planarizing cycle to prevent the substrate assembly 12 from sliding with respect to the carrier head 131. The vacuum force applied to the substrate assembly 12 and the motive force applied to the actuators 140 are also preferably controlled separately to allow the vacuum to be maintained even when a positive pressure is applied to the actuators 140. After planarizing the substrate assembly 12, the carrier head 131 lifts the substrate assembly 12 from the polishing pad and places it in a receiving station. The vacuum is then terminated and a positive air pressure can be passed through the backing member 150 to release the substrate assembly 12 from the carrier head 131.

One aspect of the backing member 150 is that the carrier head 131 can use a vacuum force to hold the substrate assembly 12 during planarization without adversely affecting the planarity of the finished surface. By first distributing the vacuum force in a first vacuum distribution, and then further distributing the vacuum force to a large number of small surface areas on the backside 15 of the substrate assembly 12 in a second vacuum distribution, deformation of the substrate assembly 12 at the secondary conduits 170 is inhibited or even prevented. A vacuum force can accordingly be applied to the substrate assembly 12 during the planarizing cycle to hold the substrate assembly 12 without adversely affecting the planarity of the finished substrate surface. Therefore, compared to prior art backing pads that couple a vacuum to the substrate assembly, the backing member 150 is expected to reduce slippage between the carrier head 131 and the substrate assembly 12 without distorting the substrate assembly 12.

Another aspect of the backing member 150 is that it may eliminate the need for attaching a retaining ring to the bottom of the carrier head. Because the backing member 150 allows the carrier head 131 to hold the substrate assembly 12 during planarization with a vacuum force, the retaining ring may be eliminated in many CMP applications. As such, the backing member 150 may eliminate the costs associated with purchasing, installing and repairing retaining rings.

Still another aspect of the backing member 150 is that it provides early detection of slippage between the carrier head 131 and the substrate assembly 12. Because the backing member 150 allows the carrier head 131 to hold the substrate assembly 12 during planarization via a vacuum force, a small loss of vacuum during the planarizing cycle will indicate that the substrate assembly 12 slipped with respect to the carrier head 131. Accordingly, the vacuum force drawn against the backside 15 of the substrate assembly 12 is preferably monitored to detect whether the substrate assembly 12 slips with respect to the carrier head 131 during planarization.

Figure 4A:
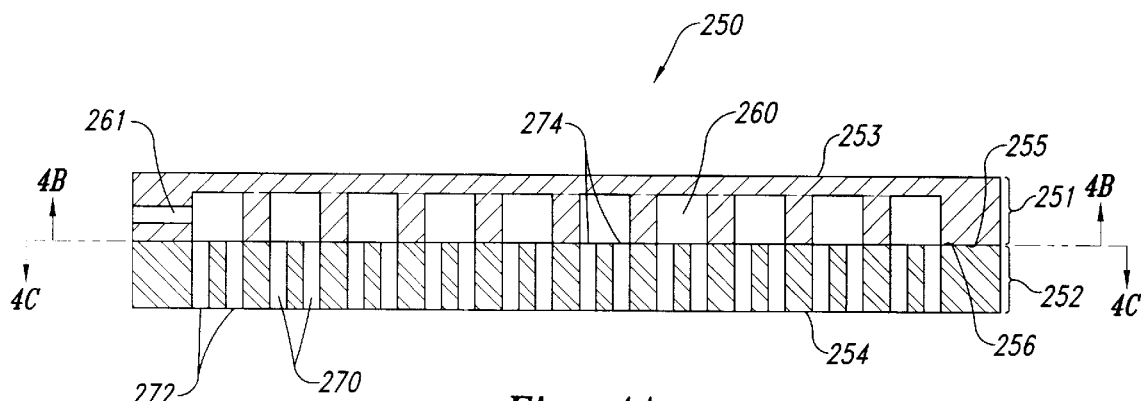
FIG. 4A is a cross-sectional view of another backing member in accordance with another embodiment of the invention.

FIG. 4A is a cross-sectional view of a backing member 250 in accordance with another embodiment of the invention. In this embodiment, the backing member 250 includes a first section 251 and a separate second section 252 attached to the first section 251. The first section 251 is preferably a disc having a top surface 253 and a bottom surface 255. The second section 252 is preferably a disc having a top surface 256 and a contact surface 254 configured to support the backside 15 of the substrate assembly 12. The bottom surface 255 of the first section 251 is attached to the top surface 256 of the second section 252 to form the backing member 250. The first and second sections 251 and 252 can be attached by an adhesive applied to the surfaces 255 and 256.

Figure 4B:
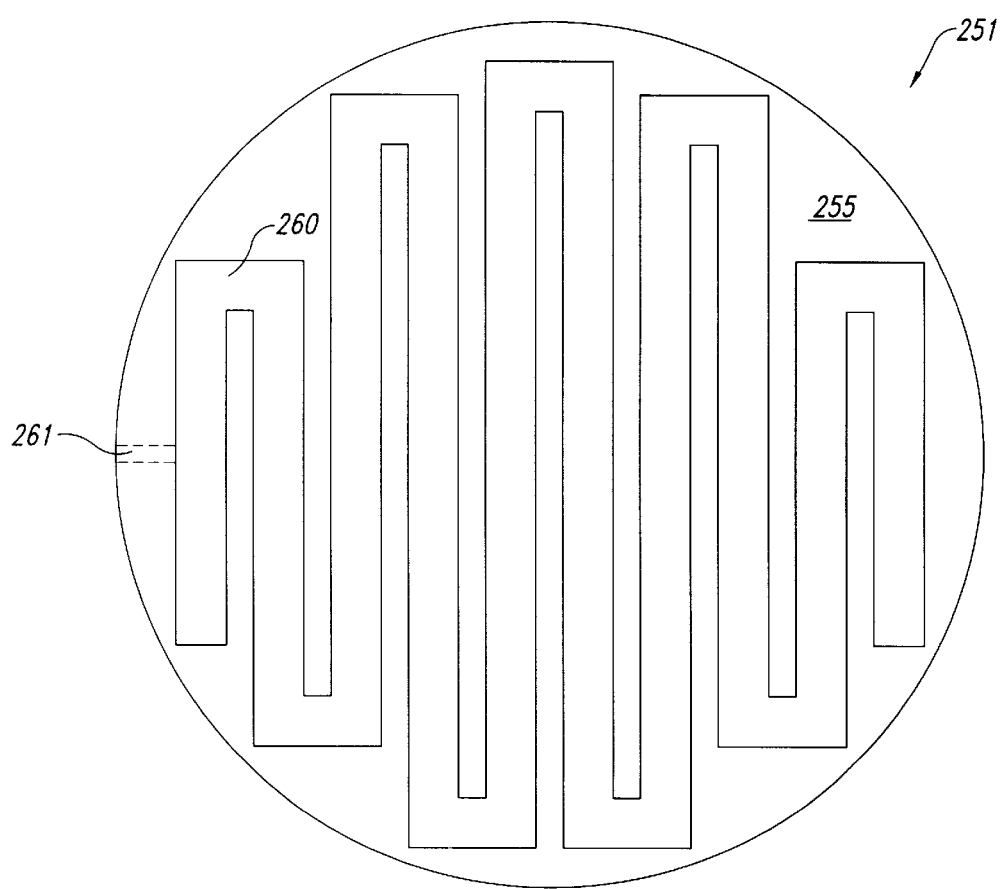
FIG. 4B is a cross-sectional view of the backing member of FIG. 4A taken along plane 4B—4B.

FIG. 4B is a cross-sectional view of the first section 251 of the backing member 250 taken along plane 4B—4B shown in FIG. 4A. The first section 251 has a primary conduit 260 and a vacuum port 261 coupled to the primary conduit 260. The primary conduit 260 can be a channel extending along the bottom surface 255 of the first section 251 in a pattern that distributes the vacuum force across a significant percentage of the surface area of the backside 15 of the substrate assembly 12. The primary conduit 260 can be a serpentine channel, as shown in FIG. 4B, but it can also be a grid with interconnected rows and columns. Accordingly, the channel can be arranged in any pattern that adequately distributes the vacuum force in a first distribution across the substrate assembly 12. The primary conduit 260 can be formed by photo-patterning the desired pattern for the channel on the bottom surface 255 of the first section, and then etching the first section 251 to an intermediate depth to form the channel.

Figure 4C:
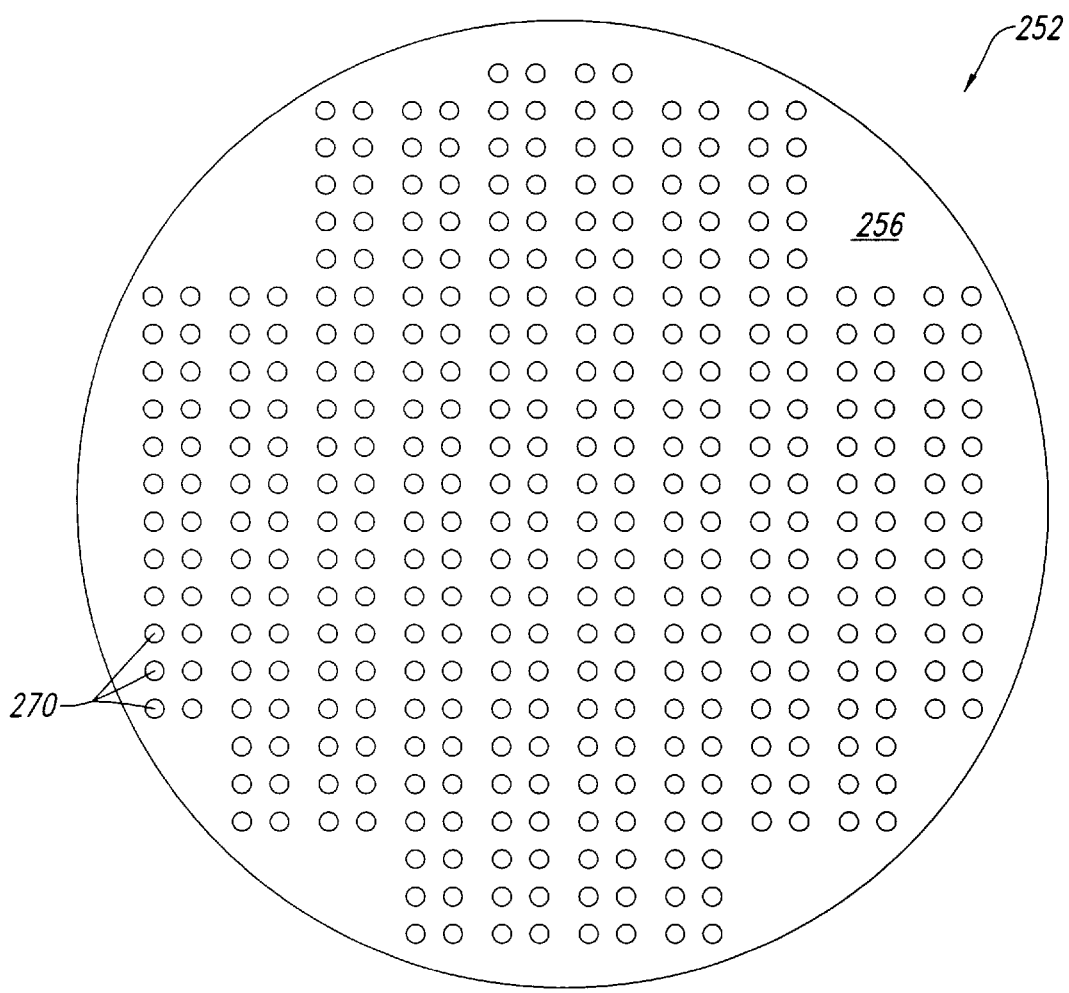
FIG. 4C is a cross-sectional view of the backing member of FIG. 4A taken along plane 4C—4C.

FIG. 4C is a cross-sectional view of the second section 252 of the backing member 250 taken along plane 4C—4C of FIG. 4A. The second section 252 has a plurality of the secondary conduits 270 extending from the top surface 256 to the contact surface 254 (FIG. 4A). The secondary conduits 270 are preferably arranged in the same pattern as the primary conduit 260. Accordingly, when the primary conduit 260 is a serpentine channel, the secondary conduits 270 are arranged in a serpentine pattern to be superimposed under the primary conduit 260 when the first and second sections 251 and 252 are assembled. As set forth above with respect to the backing member 150, the secondary conduits 270 can be formed by drilling or etching holes through the second section 252 to form small openings 272 at the contact surface 254 and small apertures 274 at the primary conduit 260 (see FIG. 4A). The backing member 250 is expected to operate in much the same manner as the backing member 150.

Figure 5A:
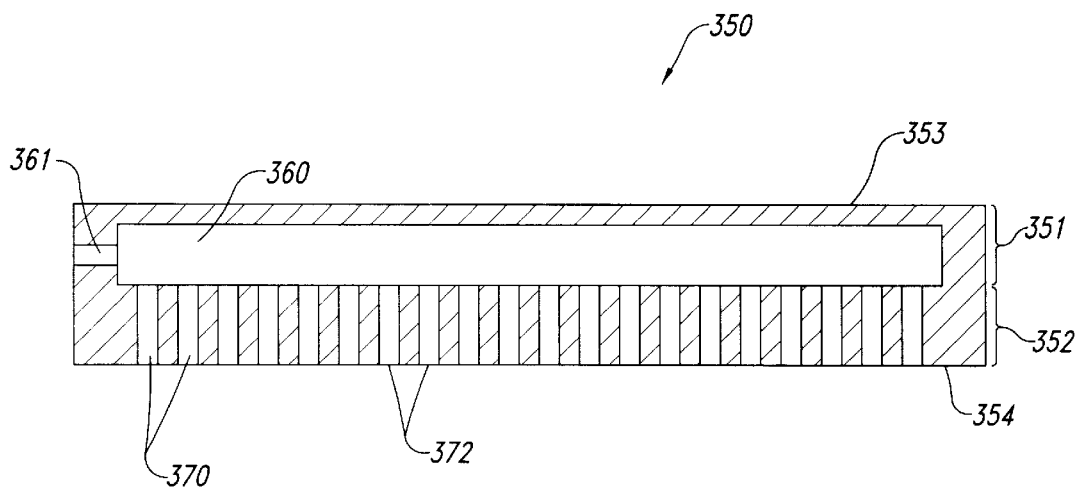
FIG. 5A is a cross-sectional view of still another backing member in accordance with still another embodiment of the invention.
Figure 5B:
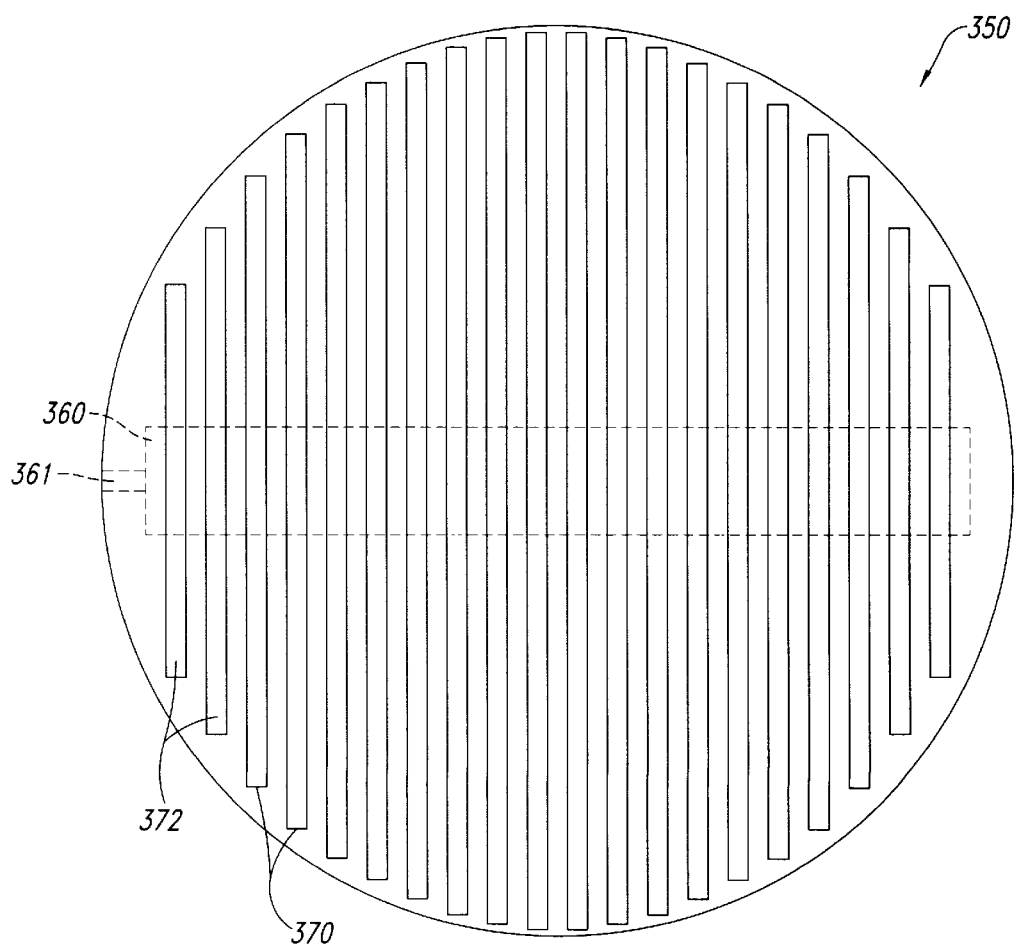
FIG. 5B is a bottom plan view of the backing member of FIG. 5A.

FIG. 5A is a cross-sectional view and FIG. 5B is a bottom plan view of a backing member 350 in accordance with still another embodiment of the invention. The backing member 350 includes first section 351 (FIG. 5A) having a primary conduit 360 and a second section 352 (FIG. 5A) having a plurality of secondary conduits 370. The first and second sections 351 and 352 can be integral with one another, or the first and second sections 351 and 352 can be separate sections (not shown) that are attached to one other. In either situation, the first section 351 has a top surface 353 configured to face the carrier head 131, and the second section 352 has a contact surface 354 configured to support the backside 15 of the substrate assembly 12.

The primary conduit 360 is preferably a channel or straight bore extending through the first section 351, and the secondary conduits 370 are preferably slots extending through the second section 352 transverse to the primary conduit 360. The primary conduit 360 can be formed by boring a large hole through the first section 351, and then plugging the opening of the hole at the edge of the first section 351. The secondary conduits 370 can be formed cutting or etching the slots from the contact surface 354 to the primary conduit 360. The primary conduit 360 and the secondary conduits 370 are coupled to a vacuum source (not shown in FIGS. 5A and 5B) by a vacuum port 361 extending from the primary conduit 360. The backing member 350 is accordingly expected to operate similarly to the backing members 150 and 250 described above.

From the foregoing it will be appreciated that, although specific embodiments of the invention have been described herein for purposes of illustration, various modifications may be made without deviating from the spirit and scope of the invention. For example, in applications that do not use substrate-shaping actuators in the carrier head, the backing members do not necessarily need to be flexible. Accordingly, the invention is not limited except as by the appended claims.

What is claimed is:

1. A backing member for selectively coupling a microelectronic-device substrate assembly to a carrier head of a planarizing machine, comprising:
    a body having a first surface configured to be received by the carrier head and substantially contacting the carrier head, and a second surface configured to support a backside of a substrate assembly;
    a first vacuum passageway extending through the body, the first passageway being configured to be coupled to a vacuum source; and
    a plurality of second vacuum passageways extending through the body, each second passageway having an aperture exposed to the first vacuum passageway, and an opening exposed at the second surface of the body, each second vacuum passageway having a fluid impermeable wall and being coupled to the first passageway to transfer a vacuum force drawn in the first passageway through the openings for pulling the backside of the substrate assembly against the second surface of the body.

2. The backing member of claim 1 wherein the body comprises a first section and a second section, the first vacuum passageway extending through the first section and the first surface being a top surface of the first section, and the plurality of second vacuum passageways extending through the second section and the second surface being a contact surface on the bottom of the second section.

3. The backing member of claim 2 wherein the first and second sections are integrally formed with one another.

4. The backing member of claim 2 wherein the first and second sections are separately formed and attached to one another.

5. The backing member of claim 1 wherein the first passageway is a primary conduit extending through the body.

6. The backing member of claim 5 wherein the primary conduit comprises a circular chamber in the body.

7. The backing member of claim 5 wherein the primary conduit comprises a channel extending through the body along a pattern, and the second passageways comprise a plurality of secondary conduits arranged in the pattern to be coupled to the channel.

8. The backing member of claim 7 wherein the pattern along which the channel extends is a serpentine pattern.

9. The backing member of claim 7 wherein the pattern along which the channel extends is a grid having a plurality of rows and columns interconnected with one another.

10. The backing member of claim 7 wherein the pattern along which the channel extends is a straight bore.

11. The backing member of claim 1 wherein the body comprises a first section and a second section, the first vacuum passageway extending through the first section and the first surface being a top surface of the first section, the plurality of second vacuum passageways extending through the second section and the second surface being a contact surface on the bottom of the second section, and the second passageways comprise a plurality of holes in the second section.

12. The backing member of claim 1 wherein the body comprises a first section and a second section, the first vacuum passageway extending through the first section and the first surface being a top surface of the first section, the plurality of second vacuum passageways extending through the second section and the second surface being a contact surface on the bottom of the second section, and the second passageways comprise a plurality of perforations through the second section.

13. The backing member of claim 1 wherein the body comprises a first section and a second section, the first vacuum passageway extending through the first section and the first surface being a top surface of the first section, the plurality of second vacuum passageways extending through the second section and the second surface being a contact surface on the bottom of the second section, and the second passageways comprise a plurality of slots in the second section having elongated openings at the contact surface.

14. The backing member of claim 1 wherein the body comprises a first section and a second section, the first vacuum passageway comprising a primary conduit extending through the first section and the first surface being a top surface of the first section, the plurality of second vacuum passageways comprising a plurality of secondary conduits extending through the second section and the second surface being a contact surface on the bottom of the second section, the primary conduit being a circular chamber in the first section, and the secondary conduits being a plurality of holes through the second section from the chamber to the contact surface, the holes having openings at the contact surface with diameters from approximately 0.01–0.125 inches, and the holes being spaced apart from one another at the contact surface by approximately 0.01–0.125 inches.

15. The backing member of claim 1 wherein the body comprises a first section and a second section, the first vacuum passageway comprising a primary conduit extending through the first section and the first surface being a top surface of the first section, the plurality of second vacuum passageways comprising a plurality of secondary conduits extending through the second section and the second surface being a contact surface on the bottom of the second section, the primary conduit being a channel extending through the first section along a pattern, and the secondary conduits being a plurality of holes through the second section arranged in the pattern of the channel in the first section to be superimposed under the channel, the holes having apertures at the channel and corresponding openings at the contact surface.

16. The backing member of claim 1 wherein the body comprises a first section and a second section, the first vacuum passageway comprising a primary conduit extending through the first section and the first surface being a top surface of the first section, the plurality of second vacuum passageways comprising a plurality of secondary conduits extending through the second section and the second surface being a contact surface on the bottom of the second section, the primary conduit being a straight bore in the first section extending in a longitudinal direction, and the secondary conduits being a plurality of slots through the second section extending transverse to the longitudinal dimension of the bore, the slots having elongated openings at the contact surface.

17. A backing member for selectively coupling a microelectronic-device substrate assembly to a carrier head of a planarizing machine, comprising a body configured to hold a backside of the substrate assembly for planarization against a polishing pad, the body including a contact surface, an upper surface that substantially contacts the carrier head, a primary vacuum conduit extending through the body, and a plurality of secondary vacuum conduits extending through the body, each secondary conduit having an aperture exposed at the primary vacuum conduit and an opening exposed at the contact surface, each secondary vacuum conduit having a fluid impermeable wall.

18. The backing member of claim 17 wherein the body comprises a thin backing member separate from the carrier head, the backing member being configured to be positioned in the carrier head, and the backing member including a first section and a second section, the primary conduit extending through the first section, the contact surface being a lower surface of the second section, and the secondary conduits extending through the second section from the primary conduit to the contact surface.

19. The backing member of claim 18 wherein the primary conduit comprises a circular chamber in the first section and the secondary conduits comprise a plurality of holes.

20. The backing member of claim 18 wherein the primary conduit comprises a channel extending through the body along a pattern and the secondary conduits comprise a plurality of holes extending from the channel through the second section to openings at the contact surface.

21. The backing member of claim 20 wherein the primary conduit comprises a straight bore through the first section and the secondary conduits comprise a plurality of slots extending transverse to the bore, the slots having elongated openings at the contact surface.

22. A backing member for selectively coupling a microelectronic-device substrate assembly to a carrier head of a planarizing machine, comprising:
 a first body section configured to be received in the carrier head, the first section including an upper surface that substantially contacts the carrier head, a vacuum port and a primary conduit coupled to the vacuum port; and
 a second body section depending from the first section, the second section including a contact surface configured to support a backside of the substrate assembly and a plurality of secondary conduits extending through the second section from the primary conduit, each secondary conduit having an aperture exposed to the primary conduit and an opening at the contact surface, each secondary conduit having a fluid impermeable wall to transfer a vacuum drawn in the primary conduit to a backside of the substrate assembly.

23. The backing member of claim 22 wherein the primary conduit comprises a circular chamber in the first section and the secondary conduits comprise a plurality of holes.

24. The backing member of claim 22 wherein the primary conduit comprises a channel extending through the body along a pattern and the secondary conduits comprise a plurality of holes extending from the channel through the second section to openings at the contact surface.

25. The backing member of claim 24 wherein the channel comprises a serpentine channel.

26. The backing member of claim 24 wherein the channel comprises a plurality of fluid paths arranged in a grid of interconnected rows and columns.

27. The backing member of claim 22 wherein the primary conduit comprises a straight bore through the first section and the secondary conduits comprise a plurality of slots extending transverse to the bore, the slots having elongated openings at the contact surface.

28. A planarizing machine for planarization of microelectric-device substrate assemblies, comprising:
 a table for carrying a polishing pad;
 a carrier assembly including a carrier head having a substrate assembly mounting zone and a vacuum source, the carrier assembly having a drive mechanism to move the carrier head with respect to the table and the polishing pad;
 a backing member in the mounting zone of the carrier head, the backing member comprising a thin body including a contact surface configured to support a backside of a substrate assembly, an upper surface that substantially contacts the carrier head, a vacuum port coupled to the vacuum source in the carrier head, a primary vacuum conduit extending through the body coupled to the vacuum port, and a plurality of secondary vacuum conduits extending through the body, each secondary conduit having an aperture exposed at the primary vacuum conduit and an opening exposed at the contact surface, each secondary conduit having a fluid impermeable wall, the primary conduit distributing a vacuum force drawn through the vacuum port in a first vacuum distribution and a secondary conduits distributing the first vacuum distribution into a second vacuum distribution at the contact surface for coupling the substrate assembly to the carrier head.

29. The planarizing machine of claim 28 wherein the body comprises a first section and a second section, the primary conduit extending through the first section, the contact surface being a lower surface of the second section, and the secondary conduits extending through the second section from the primary conduit to the contact surface.

30. The planarizing machine of claim 29 wherein the primary conduit comprises a circular chamber in the first section and the secondary conduits comprise a plurality of holes.

31. The planarizing machine of claim 29 wherein the primary conduit comprises a channel extending through the body along a pattern and the secondary conduits comprise a plurality of holes extending from the channel through the second section to openings at the contact surface.

32. The planarizing machine of claim 29 wherein the primary conduit comprises a straight bore through the first section and the secondary conduits comprise a plurality of slots extending transverse to the bore, the slots having elongated openings at the contact surface.

33. The backing member of claim 28, being further comprised of a plurality of substrate shaping actuators positioned on the upper surface of the thin body, the backing member being positioned in the carrier head with the shaping actuators positioned between the carrier head and a substrate assembly mounted to the backing member, and wherein the vacuum force is separate from a motive force that controls the actuators.

34. The backing member of claim 33 wherein the body of the backing member is a flexible, incompressible disc, the shaping actuators flexing the body to create a desired substrate curvature for planarizing the substrate.

35. A planarizing machine for planarization of microelectronic-device substrate assemblies, comprising:

a table for carrying a polishing pad;

a carrier assembly including a carrier head having substrate assembly mounting zone and a vacuum source, the carrier assembly having a drive mechanism to move the carrier head with respect to the table and the polishing pad;

a backing member including a first section configured to be received in the carrier head and a second section depending from the first section, the first section having an upper surface that substantially contacts the carrier head, a vacuum port coupled to the vacuum source of the carrier head and a primary conduit coupled to the vacuum port, and the second section having a contact surface and plurality of secondary conduits extending through the second section, each secondary conduit having an aperture exposed at the primary conduit and an opening exposed at the contact surface, each secondary conduit having a fluid impermeable wall to transfer a vacuum drawn in the primary conduit to a backside of the substrate assembly.

36. The planarizing machine of claim 35 wherein the first and second sections are integrally formed with one another.

37. The planarizing machine of claim 35 wherein the first and second sections are separately formed and attached to one another.

38. The planarizing machine of claim 35 wherein the primary conduit comprises a circular chamber in the body.

39. The planarizing machine of claim 37 wherein the primary conduit comprises a channel extending through the body along a pattern, and the second passageways comprise a plurality of secondary conduits arranged in the pattern to be coupled to the channel.

40. The planarizing machine of claim 39 wherein the pattern along which the channel extends is a serpentine pattern.

41. The planarizing machine of claim 39 wherein the pattern along which the channel extends is a grid having a plurality of rows and columns interconnected with one another.

42. The planarizing machine of claim 39 wherein the pattern along which the channel extends is a straight bore.

43. The planarizing machine of claim 35 wherein the body comprises a first section and a second section, the primary conduit extending through the first section and the first surface being a top surface of the first section, the plurality of secondary conduits extending through the second section and the second surface being a contact surface on the bottom of the second section, and the secondary conduits comprise a plurality of holes in the second section.

44. The planarizing machine of claim 35 wherein the body comprises a first section and a second section, the primary conduit extending through the first section and the first surface being a top surface of the first section, the plurality of secondary conduits extending through the second section and the second surface being a contact surface on the bottom of the second section, and the secondary conduits comprise a plurality of perforations through the second section.

45. The planarizing machine of claim 35 wherein the body comprises a first section and a second section, the first vacuum passageway extending through the first section and the first surface being a top surface of the first section, the plurality of second vacuum passageways extending through the second section and the second surface being a contact surface on the bottom of the second section, and the second passageways comprise a plurality of slots in the second section having elongated openings at the contact surface.

46. The planarizing machine of claim 35 wherein the body comprises a first section and a second section, the primary conduit extending through the first section and the first surface being a top surface of the first section, the plurality of secondary conduits extending through the second section and the second surface being a contact surface on the bottom of the second section, the primary conduit being a circular chamber in the first section, and the secondary conduits being a plurality of holes through the second section from the chamber to the contact surface, the holes having openings at the contact surface with diameters from approximately 0.01–0.125 inches, and the holes being spaced apart from one another at the contact surface by approximately 0.01–0.125 inches.

47. The planarizing machine of claim 35 wherein the body comprises a first section and a second section, the first vacuum passageway comprising a primary conduit extending through the first section and the first surface being a top surface of the first section, the plurality of second vacuum passageways comprising a plurality of secondary conduits extending through the second section and the second surface being a contact surface on the bottom of the second section, the primary conduit being a channel extending through the first section along a pattern, and the secondary conduits being a plurality of holes through the second section arranged in the pattern of the channel in the first section to be superimposed under the channel, the holes having apertures at the channel and corresponding openings at the contact surface.

48. The planarizing machine of claim 35 wherein the body comprises a first section and a second section, the first vacuum passageway comprising a primary conduit extending through the first section and the first surface being a top surface of the first section, the plurality of second vacuum passageways comprising a plurality of secondary conduits extending through the second section and the second surface being a contact surface on the bottom of the second section, the primary conduit being a straight bore in the first section extending in a longitudinal direction, and the secondary conduits being a plurality of slots through the second section extending transverse to the longitudinal dimension of the bore, the slots having elongated openings at the contact surface.

49. The planarizing machine of claim 35, further comprising a plurality of substrate shaping actuators positioned in the carrier head, the backing member being positioned under the shaping actuators to be between the actuators and a substrate assembly mounted to the carrier head, and wherein the vacuum force is separate from a motive force that controls the actuators.

50. A method of removably attaching a microelectronic-device substrate assembly to a backing member that substantially contacts a carrier head when connected to the carrier head during planarization against a polishing pad, comprising:

distributing a vacuum throughout a first portion of the backing member that substantially contacts the carrier head by drawing a vacuum through a primary conduit in the backing member; and transferring the distributed vacuum from the first portion of the backing member by transferring the vacuum in the primary conduit to a plurality of secondary conduits, each secondary conduit being coupled to the primary conduit and having a fluid impermeable wall, the secondary conduit having an aperture exposed at the primary conduit and an opening exposed to the substrate assembly at a contact surface, to apply a vacuum force to the substrate assembly to hold the substrate assembly against the backing member.

51. The method of claim 50 wherein drawing a vacuum through the primary conduit comprises drawing a vacuum in a circular chamber in the backing member, and transferring the vacuum force through the secondary conduits comprises restricting the vacuum force through a plurality of holes extending between the primary conduit and the contact surface.

52. The method of claim 51 wherein drawing a vacuum through the primary conduit comprises drawing a vacuum in an open chamber in the backing member, and transferring the vacuum force through the secondary conduits comprises restricting the vacuum force through a plurality of slots extending between the primary conduit and the contact surface.

53. The method of claim 51 wherein drawing a vacuum through the primary conduit comprises drawing a vacuum in a channel in the backing member, and transferring the vacuum force through the secondary conduits comprises restricting the vacuum force through a plurality of holes extending from the channel to the contact surface.

54. The method of claim 51 wherein drawing a vacuum through the primary conduit comprises drawing a vacuum in a channel in the backing member, and transferring the vacuum force through the secondary conduits comprises restricting the vacuum force through pores between the channel and the contact surface.

55. A method of planarizing a microelectronic-device substrate assembly, comprising:

holding a substrate assembly to a carrier head by applying a vacuum through a backing member that substantially contacts the carrier head when positioned within the carrier head, the vacuum force being applied by drawing a vacuum through a primary conduit in backing member to distribute a vacuum force in a first vacuum distribution relative to the substrate assembly and transferring the vacuum force from the primary conduit through a plurality of secondary conduits in the backing member coupled to the primary conduit to redistribute the vacuum force in a second vacuum distribution at a contact surface of the backing member, each secondary conduit having a fluid impermeable wall and having an aperture exposed to the primary conduit and an opening exposed at the contact surface, the vacuum force acting against the substrate assembly in the second vacuum distribution to hold the substrate assembly against the contact surface; and removing material from the substrate assembly by pressing the substrate assembly against a planarizing surface of a polishing pad and moving at least one of the substrate or the polishing pad to impart relative motion therebetween while holding the substrate to the carrier head with the vacuum force.

56. The method of claim 55 wherein drawing a vacuum through the primary conduit comprises drawing a vacuum in a circular chamber in the backing member, and transferring the vacuum force through the secondary conduits comprises restricting the vacuum force through a plurality of holes extending between the primary conduit and the contact surface.

57. The method of claim 55 wherein drawing a vacuum through the primary conduit comprises drawing a vacuum in an open chamber in the backing member, and transferring the vacuum force through the secondary conduits comprises restricting the vacuum force through a plurality of slots extending between the primary conduit and the contact surface.

58. The method of claim 55 wherein drawing a vacuum through the primary conduit comprises drawing a vacuum in a channel in the backing member, and transferring the vacuum force through the secondary conduits comprises restricting the vacuum force through a plurality of holes extending from the channel to the contact surface.

59. The method of claim 55 wherein drawing a vacuum through the primary conduit comprises drawing a vacuum in a channel in the backing member, and transferring the vacuum force through the secondary conduits comprises restricting the vacuum force through pores between the channel and the contact surface.

* * * * *